United States Patent [19]

Nishiyama et al.

[11] 4,318,796
[45] Mar. 9, 1982

[54] SPUTTERING APPARATUS

[75] Inventors: Hiroshi Nishiyama, Mukou; Suehiro Kato, Nagaokakyo; Takeshi Nakamura, Uji, all of Japan

[73] Assignee: Murata Manufacturing Co., Ltd., Kyoto, Japan

[21] Appl. No.: 169,027

[22] Filed: Jul. 15, 1980

[51] Int. Cl.³ .............................................. C23C 15/00
[52] U.S. Cl. .................................. 204/298; 204/192 R
[58] Field of Search ........... 204/192 R, 192 C, 192 D, 204/298

[56] References Cited

FOREIGN PATENT DOCUMENTS 47-35665 9/1972 Japan .................................. 204/298

*Primary Examiner*—Aaron Weisstuch
*Attorney, Agent, or Firm*—Birch, Stewart, Kolasch & Birch

[57] ABSTRACT

There is disclosed a sputtering apparatus for the deposition of thin films of a material other than metals on substrates, comprising a pair of opposed electrodes one of which is adapted to mount a substrate, wherein a target of a material other than metals, from which thin-film-forming atoms are ejected by ion-bombardment during sputtering, is mounted on the other electrode, said target comprising at least two target members stacked on one another.

This target installation prevents thin films of a material other than metals from contamination resulting from breakage of the target which in turn results from an increase of the film-forming rate or physical properties of the target material.

5 Claims, 3 Drawing Figures

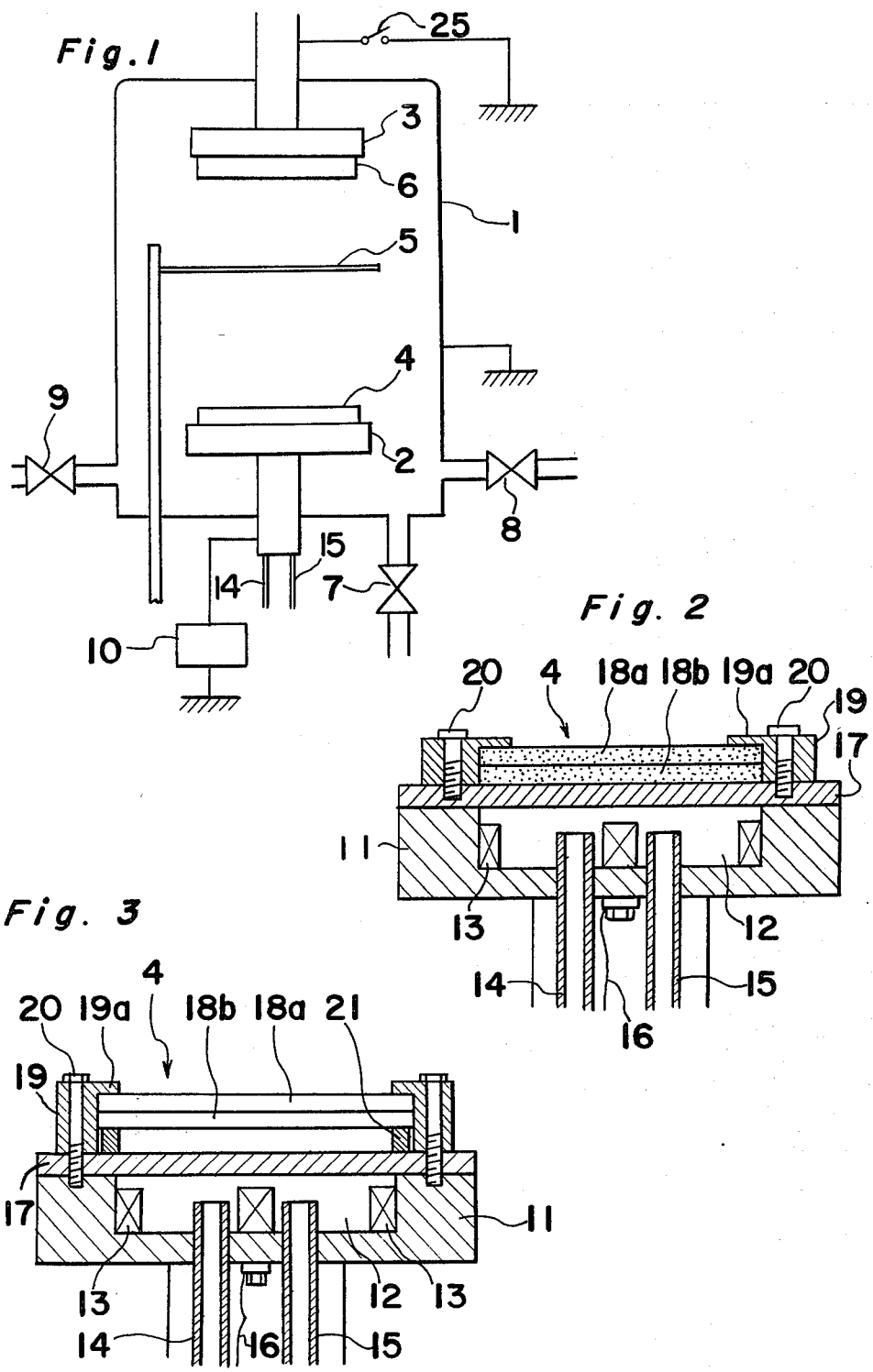

SPUTTERING APPARATUS

BACKGROUND OF THE INVENTION

1. Field of the Invention

The present invention relates to sputtering apparatus for the deposition of thin films of a material other than metals on substrates. More particularly, it relates to a structure of a target installation of the sputtering apparatus, which prevents contamination of the thin films resulting from thermal breakage of a porous or poor heat-conducting target of a material other than metals during sputtering.

2. Description of the Prior Art

There are many sputtering systems such as, for example, diode DC sputtering systems, triode DC sputtering systems, radio-frequency sputtering systems, which are used for producing a thin film on a substrate. In all these sputtering systems, when producing thin films of a material other than metals it is conventional to mount a target of a film-forming material on a cathode of a sputtering system by means of fittings, thereby making the target and the cathode come closely into contact. However, a target installation of such structure has serious problems awaiting a solution. For example, in the radio-frequency sputtering systems the rate of forming thin films increases with an increase of the amount of the radio-frequency electric power supplied to the target so that it is customary to supply as much electric power as possible to increase the film-forming rate. However, the supply of a large amount of electric power frequently causes breakage of the target when the target is of a material other than metals such as, for example, ceramics, glasses, resins, sintered alloys and the like. The breakage of the target results in contamination of the thin films because the cathode is impacted by ions which are produced by a gaseous discharge and passed through cracks of the target, thereby ejecting the atoms of the cathode material.

It appears that one of the reasons why breakage of the target occurs during sputtering is the difference in temperature between the cathode and the target which occurs during sputtering for the following reasons. During sputtering, the target generates heat as a result of ion-bombardment, while the cathode is cooled by cooling water. Since the target of the above material is porous or poorly heat-conducting, its temperature is considerably increased. Accordingly, increasing the electricity supplied to such a porous or poor heat-conducting target results in a large temperature differential between the target and the cathode. Furthermore, the heat generated by the ion-bombardment causes the target to expand so that the target breaks when its thermal expansion force is greater than its tensile strength.

In order to overcome the above problem, it has been proposed to reinforce the porous or poor heat-conducting target by placing a solid reinforcing layer between the target and the cathode, which is formed by coating a paste or mixture of a binder and ceramic or glass powder on one surface of the target to be in contact with the cathode, and then heat-treating the paste. However, it is difficult with such a reinforcing layer to avoid breakage of the target.

SUMMARY OF THE INVENTION

It is therefore an object of the present invention to provide a structure of a target installation in a sputtering apparatus for the deposition of thin films of a material other than metals, such as ceramics, glasses, resins, sintered alloys and the like, on substrates, which prevents a porous or poor heat-conducting target of the above material from breaking during sputtering.

According to the present invention, there is provided a sputtering apparatus for the deposition of thin films of a material other than metals on substrates, comprising a pair of opposed electrodes, one of which is adapted to mount a substrate, wherein a target from which thin-film-forming atoms are ejected by ion-bombardment during sputtering is mounted on the other electrode, said target comprising at least two target members stacked or piled on one another.

In the preferred embodiment, a non-heat conducting layer may be placed between the target and the other electrode. The provision of the non-heat conducting layer enables an increase in electric power supplied to the target, thereby increasing the film-forming rate and improving the film quality. This non-heat conducting layer may be a non-heat conducting space or may be made of a heat-insulating material such as asbestos, quartz and the like.

According to the present invention, it is possible to prevent contamination of thin films of a material other than metals resulting from breakage of the target which in turn results from an increase of the film-forming rate or physical properties of the target material.

BRIEF DESCRIPTION OF THE DRAWNGS

The invention together with other objects, features and advantages thereof will be further understood by referring to the following description taken in conjunction with the accompanying drawings; wherein FIG. 1 is a schematic diagram showing a general construction of a radio-frequency sputtering apparatus used in conjunction with the present invention;

FIG. 2 is an enlarged view of FIG. 1 showing an essential part of the present invention.

FIG. 3 is an enlarged sectional view showing another embodiment of the present invention.

DETAILED DESCRIPTION OF THE INVENTION

Referring now to FIG. 1 there is shown a high-speed radio-frequency diode sputtering apparatus which comprises a bell jar 1, a pair of opposed parallel electrodes, i.e., a planar cathode 2 and a planar anode 3, and a shutter 5 positioned between the electrodes. The bell jar 1 is provided with vents 7 and 8 which are respectively connected to a vacuum pump (not shown) and an inlet 9 for an ionizable medium such as oxygen gas, nitrogen gas, argon gas and the like. The gas inlet 9 is connected to an ionizable medium source (not shown). The bell jar 1 is grounded. The anode 3 may be grounded through a switch 25 as occasion demands. One terminal of a radio-frequency electric power source 10 of 13.5 MHz is electrically connected to the cathode 2 and the other terminal is grounded. A radio-frequency voltage is applied therefrom between the cathode 2 and the bell jar 1. A target 4 of a material other than metals is mounted on the cathode 2 by fittings 19 (FIG. 2) in accordance with the present invention. A substrate 6 on which a thin film is formed is mounted on the anode opposite to the target 4 in the conventional manner, and heated to a temperature ranging from 200° to 500° C. during sputtering.

Referring now to FIG. 2, the cathode 2 is composed of a cathode body 11 with an annular recess 12 provided therein, and a cathode plate 17 on which the target 4 of a material such as ceramics, glasses, resins, sintered alloys and the like is mounted by means of a spacer such as a metal O-ring 19 with an inwardly extending flange 19a and bolts 20. An annular magnet 13 is arranged in the recess 12 of the cathode body 11. The cathode body 11 is also provided with inlet and outlet pipes 14 and 15 so that cooling water is fed into the recess 12 through the inlet pipe 14 and drawn therefrom through the outlet pipe 15. The target 4 comprises two disc-shaped target members 18a, 18b which are piled one another and held in the O-ring 19 mounted on the cathode plate 17 and fixed by bolts 20. The target members 18a and 18b are forced on the cathode plate 17 by the flange 19a of the O-ring 19.

The apparatus may be operated, for example, in the following manner. The bell jar 1, after being rendered airtight, is evacuated by the vacuum pump through the vents 7 and 8 to a vacuum of more than $1 \times 10^{-6}$ Torr. An ionizable medium such as argon or oxygen or mixture thereof is introduced into the bell jar 1 through the gas inlet 9, thereby adjusting the pressure in the bell jar to $1 \times 10^{-1}$ to $10^{-4}$ Torr. A radio-frequency voltage is applied to the cathode 2 from the radio-frequency electric power source 10 to discharge electricity between the cathode 2 and the anode 3, thereby effecting the ionization of the ionizable medium. The ions of the medium impact the upper target member 18a so that atoms of the film-forming material are ejected from the surface of the target member 18a as a result of the ion-bombardment and are deposited on the substrate 6 to form a thin film.

EXAMPLE 1

Two disc-shaped ceramic target members 18a, 18b each having a 150 mm diameter and a 3 mm thickness were mounted on the cathode plate 17, and the sputtering was carried out in the manner described above but without grounding of the cathode 3. Each of the ceramic target members is composed of a ceramic having a composition consisting essentially of 99% of ZnO and 1% of Mn. Breakage was observed on the upper target member 18a in the direction of its thickness, but never observed on the lower target member 18b even when radio-frequency electric power was supplied to the target in an amount of 7 to 8 w/cm$^2$. Analysis of the produced crystalline thin film shows that there is no impurity which has a bad influence upon the characteristics of the films.

In contrast thereto, a ceramic target, which has a 150 mm diameter and a 6 mm thickness and consisting of 99% of ZnO and 1% of Mn, mounted in the conventional manner incurred breakage with electrical power of 1.7 to 2.2 w/cm$^2$. The resultant thin film was contaminated by impurities ejected from the cathode plate.

EXAMPLE 2

Two target members 18a, 18b were stacked and mounted on an O-ring 21 placed on the cathode plate 17. The O-ring 19 was placed on the target members 18a, 18b and the O-ring 21 and secured to the cathode plate 17 by bolts 20, as shown in FIG. 3. Each target member is composed of a ceramic having a composition consisting essentially of 99% of ZnO and 1% of Mn and has a 150 mm diameter and a 3 mm thickness. The O-ring 21 forms a non-heatconducting empty space layer between the target members 18a, 18b and the cathode plate 17. The sputtering was carried out in the same manner as in example 1 and a radio-frequency electric power of 7 to 8 w/cm$^2$ was supplied to the cathode body. Although it was observed that the upper target member 18a incurred slight breakage in the direction of its thickness, the lower target member incurred no breakage. The analysis of the produced thin film of zinc oxide containing manganese showed that there are no impurities which have a bad influence upon the characteristics of the thin film.

The reason why the target fixed in accordance with the present invention produces no contamination even at a high electric power is that even if the upper target member 18a breaks, there is no fear of mixing of impurities into thin films since the ion-bombardment of the cathode plate is prevented by the lower target member which is present between the upper target member and the cathode plate. The target member which shows the rise of temperature by ion-bombardment is the upper one, and the temperature of the lower target member 18b is raised only by the thermal conduction from the upper target member 18a. Thus, there is no fear of contamination of thin films due to breakage of the target even if high electric power is supplied to the target to increase the film-forming rate.

In the case of example 2, the temperature of the target, particularly that of the upper target member 18a, is elevated since the heat conduction between the target and the cooled cathode plate 17 is reduced by the non-heatconducting space layer formed by the O ring 21. This elevated temperature of the target increases the sputtering of thin-film-forming atoms from the surface of the target, thereby increasing the film-forming rate. For example, the film-forming rate in example 2 was 1300 to 2000 A/min, which is considerably increased as compared with the prior art film-forming rate of 500 to 800 A/min. Further, the elevated temperature of the target promotes the chemical reaction to produce thin films with good quality.

In the foregoing, the present invention has been described in connection with a diode radio-frequency sputtering apparatus, but it will be apparent that the present invention may be applied to any other sputtering apparatus such as, for example, diode DC sputtering apparatus, triode DC sputtering apparatus, magnetron sputtering apparatus, reactive sputtering apparatus, bias sputtering apparatus and the like.

Further, the present invention may be applied to any target material other than metals, such as glasses, synthetic resins, sintered alloys and the like. The number of pieces of the target member may be three or more.

What we claim is:

1. A sputtering apparatus for the deposition of thin films of a material other than metals on substrates, comprising a pair of opposed electrodes, one of which is adapted to mount a substrate thereon, wherein a target of a material other than metals, from which thin-film-forming atoms are ejected by ion-bombardment during sputtering, is mounted on the other electrode, said target comprising at least two target members made of substantially the same material and stacked on one another, said stacked target members being thermally insulated by a non-heat conducting layer placed between the lowermost target member and the other electrode.

2. The sputtering apparatus according to claim 1 wherein said non-heat conducting layer is an empty space formed by a spacer placed between the lowermost target member and the other electrode.

3. The sputtering apparatus according to claim 2, wherein said spacer is an O-ring.

4. The sputtering apparatus according to claim 1 wherein said non-heat conducting layer is made of a heat-insulating material.

5. The sputtering apparatus according to claim 4, wherein said heat-insulating material is asbestos or quartz.

* * * * *